(12) United States Patent
Kataoka et al.

(10) Patent No.: US 10,930,466 B2
(45) Date of Patent: Feb. 23, 2021

(54) ION MILLING APPARATUS AND SAMPLE HOLDER

(71) Applicant: JEOL Ltd., Tokyo (JP)

(72) Inventors: Shogo Kataoka, Tokyo (JP); Shunsuke Asahina, Tokyo (JP)

(73) Assignee: JEOL Ltd., Tokyo (JP)

( * ) Notice: Subject to any disclaimer, the term of this patent is extended or adjusted under 35 U.S.C. 154(b) by 253 days.

(21) Appl. No.: 15/988,591

(22) Filed: May 24, 2018

(65) Prior Publication Data

US 2018/0342369 A1    Nov. 29, 2018

(30) Foreign Application Priority Data

May 26, 2017  (JP) .............................. JP2017-105077

(51) Int. Cl.
*H01J 37/20* (2006.01)
*H01J 37/305* (2006.01)
*C23C 14/58* (2006.01)

(52) U.S. Cl.
CPC .......... *H01J 37/20* (2013.01); *C23C 14/5833* (2013.01); *H01J 37/3056* (2013.01); *H01J 2237/026* (2013.01); *H01J 2237/20214* (2013.01); *H01J 2237/20235* (2013.01); *H01J 2237/31745* (2013.01); *H01J 2237/31749* (2013.01)

(58) Field of Classification Search
CPC .. C23C 14/5833; H01J 37/20; H01J 2237/026
See application file for complete search history.

(56) References Cited

U.S. PATENT DOCUMENTS

| 2005/0118065 A1* | 6/2005 | Hasegawa | H01J 37/28 422/502 |
| 2015/0255248 A1* | 9/2015 | Boguslavsky | H01J 37/3056 204/192.34 |

FOREIGN PATENT DOCUMENTS

JP         200591094 A    4/2005

\* cited by examiner

*Primary Examiner* — Jason Berman
(74) *Attorney, Agent, or Firm* — The Webb Law Firm

(57) ABSTRACT

An ion milling apparatus includes an ion irradiation source, a sample holder, a sample stage, a rotation mechanism, and a slide mechanism. The sample holder holds a sample such that the sample protrudes from a shielding plate in a direction perpendicular to an optical axis of an ion beam. The rotation mechanism is disposed such that a rotation center of a rotation shaft is perpendicular to the optical axis of the ion beam and parallel to a direction in which the sample protrudes from the shielding plate. The rotation mechanism supports the sample stage such that the sample stage is rotatable. The slide mechanism supports the sample held by the sample holder such that the sample is movable along the optical axis of the ion beam.

3 Claims, 17 Drawing Sheets

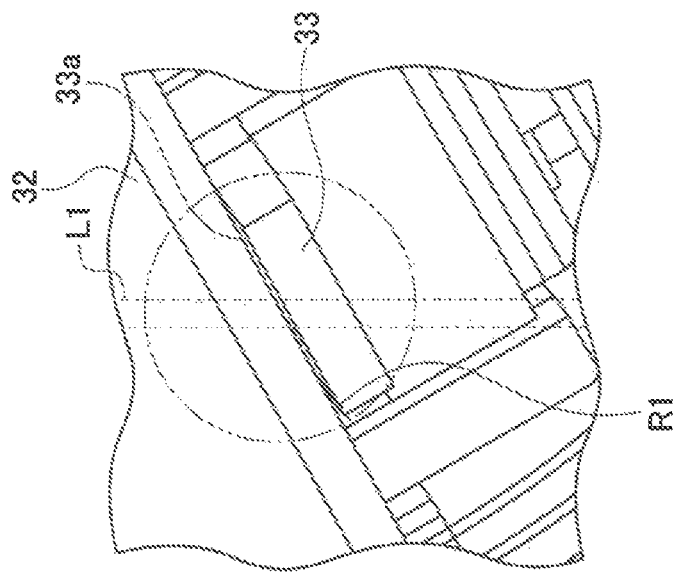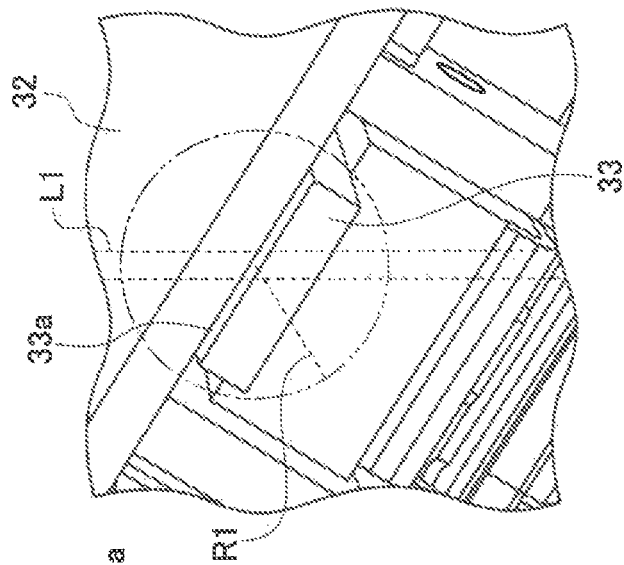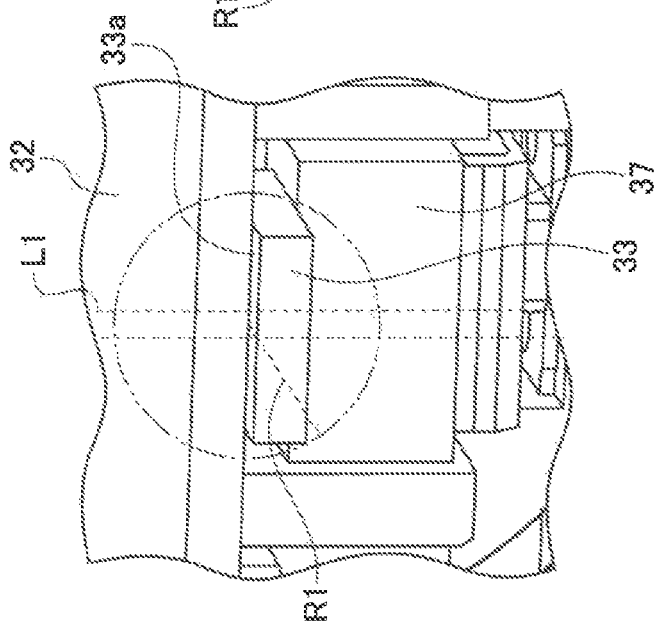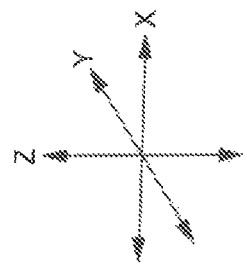

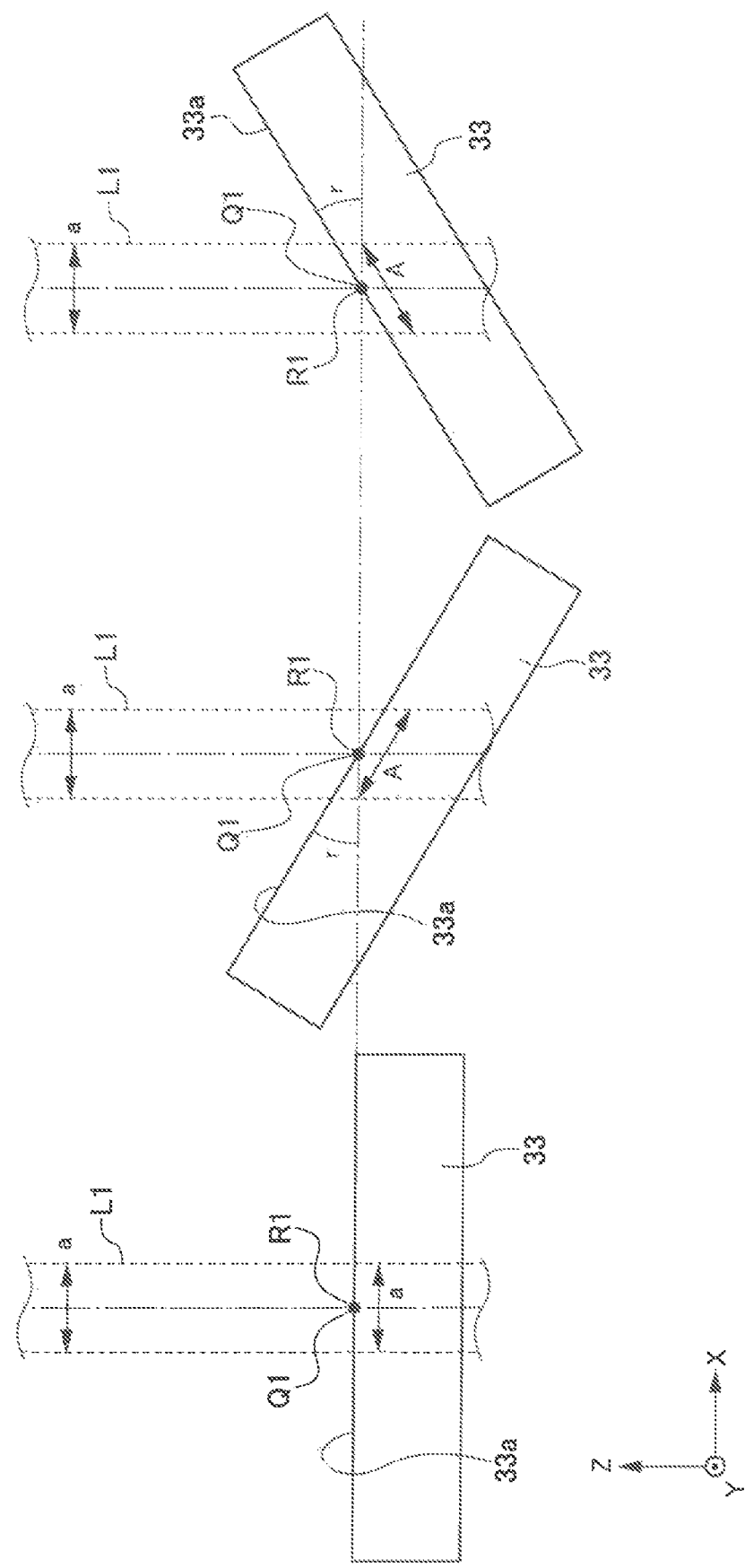

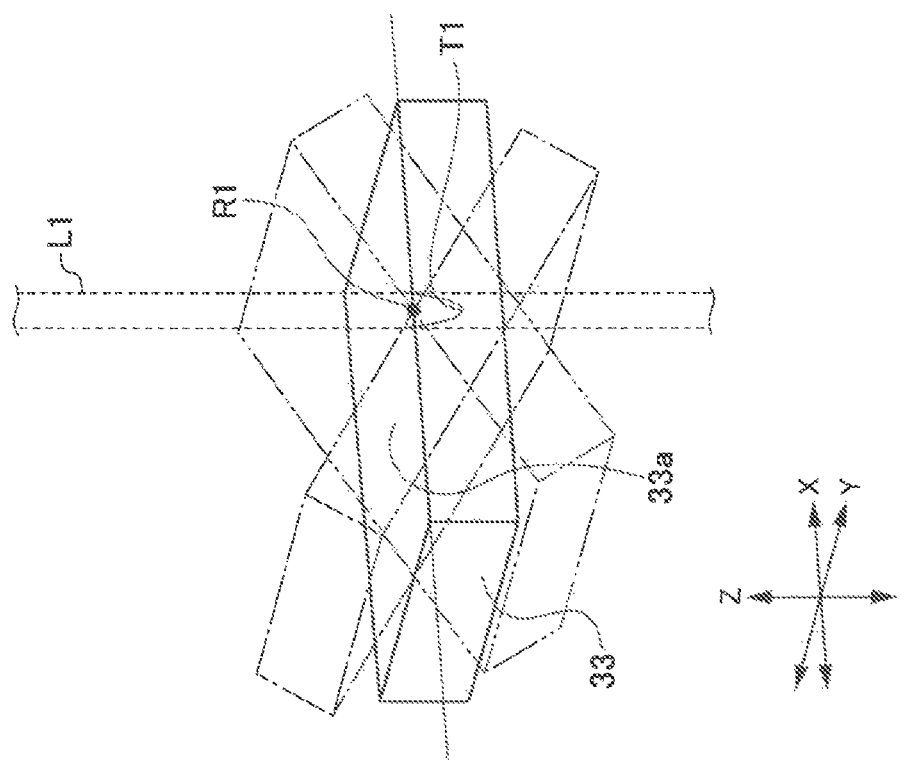

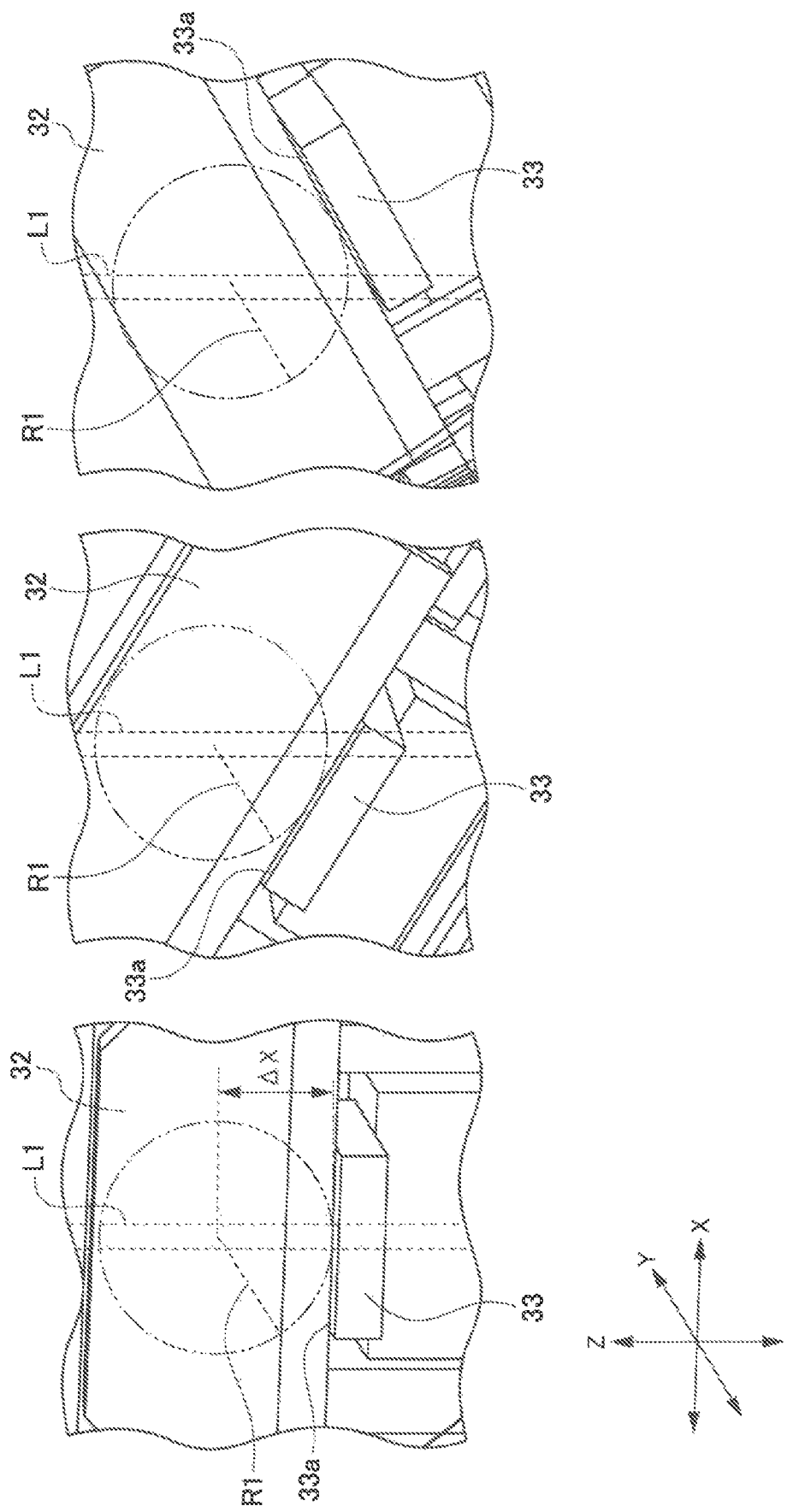

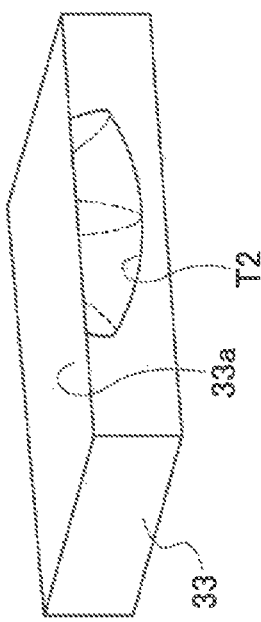
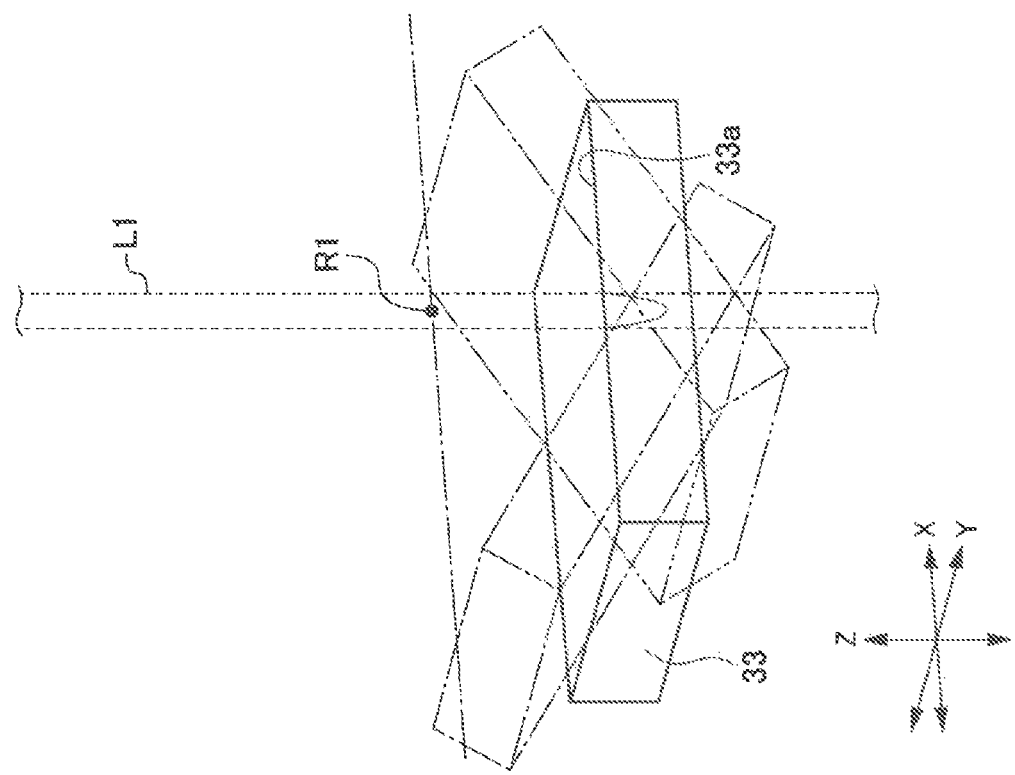
FIG. 12B
FIG. 12A

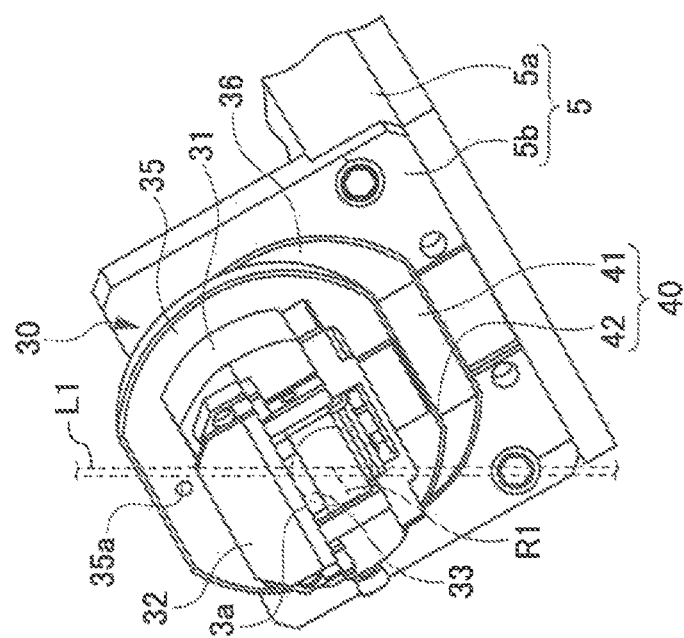
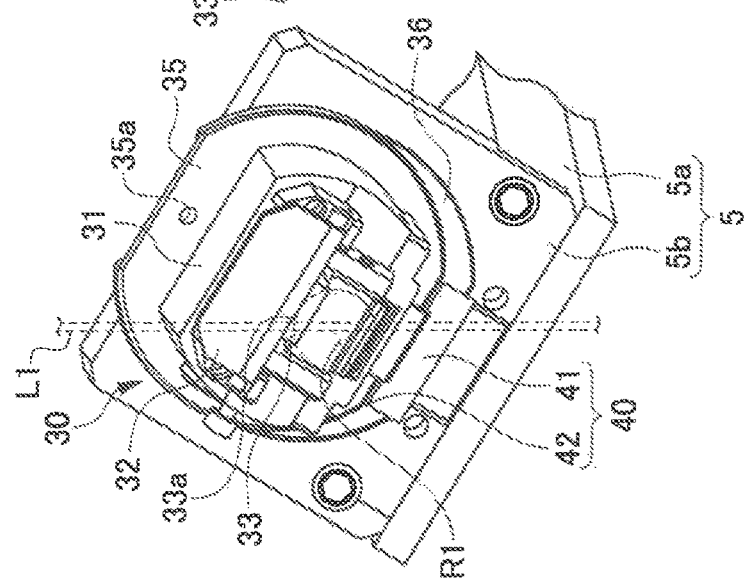
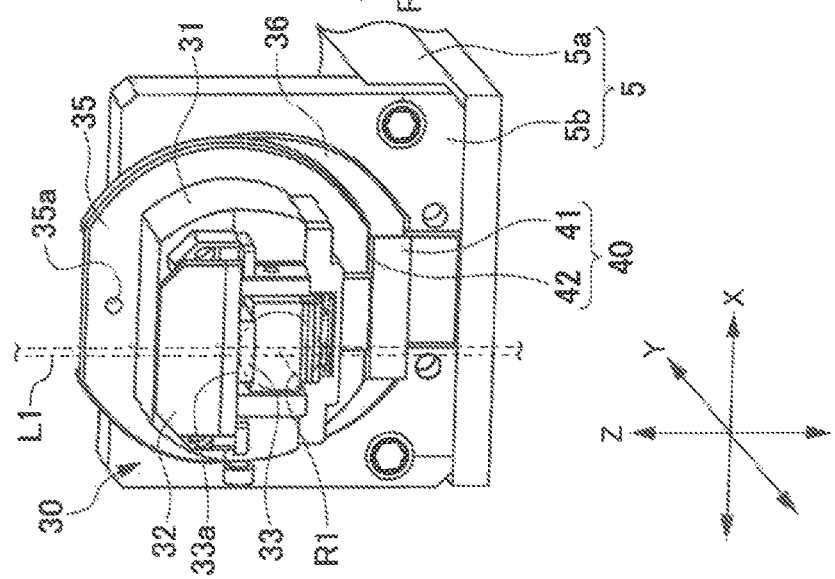

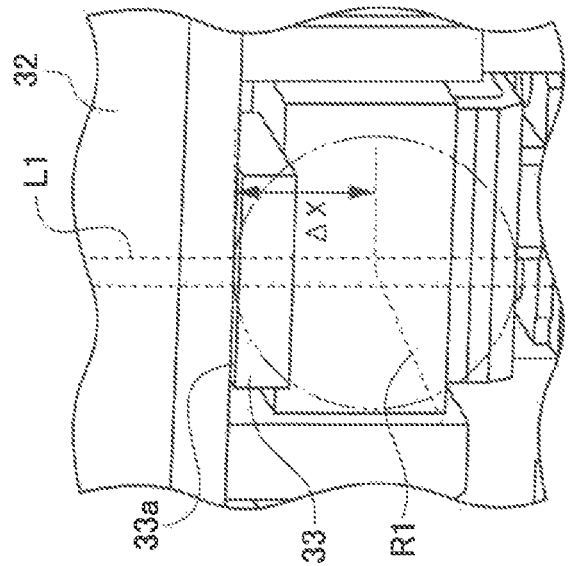
FIG. 14A
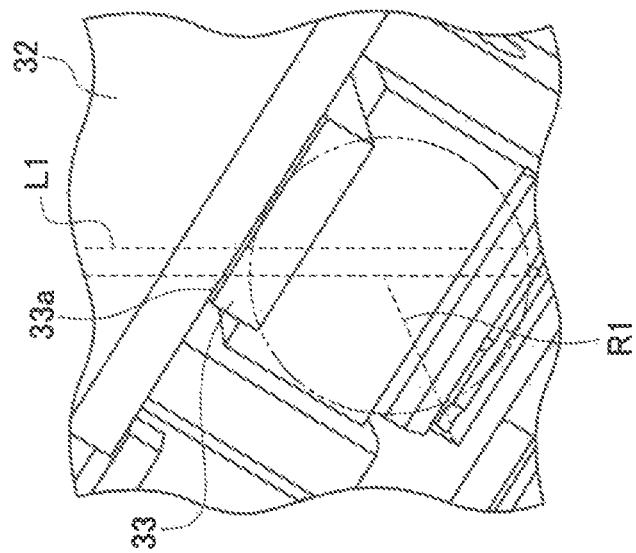
FIG. 14B
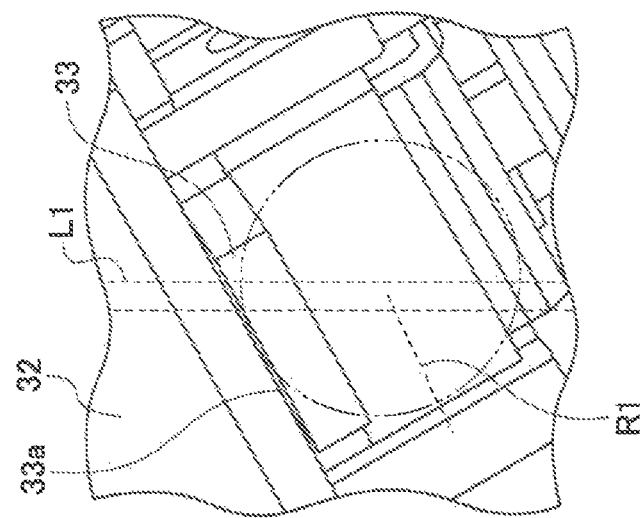
FIG. 14C
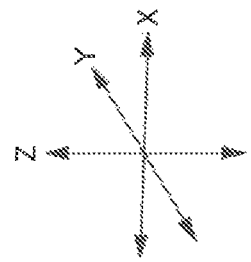

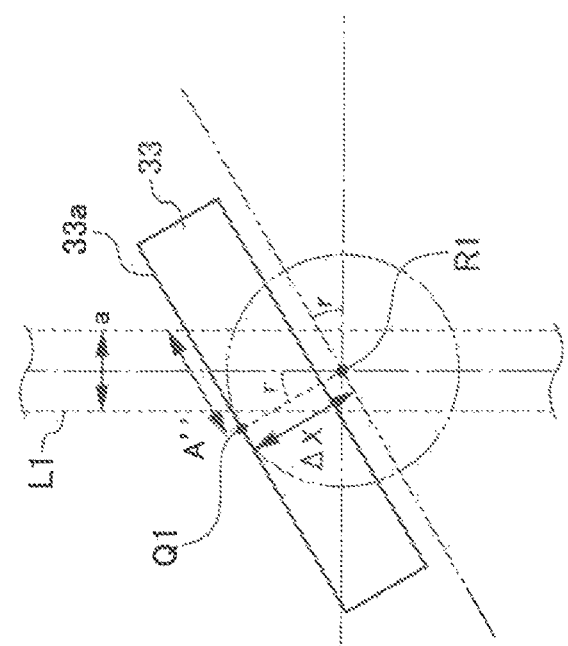
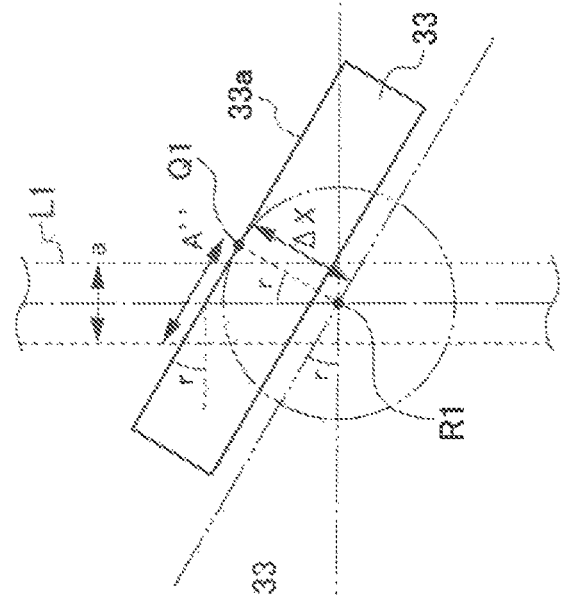
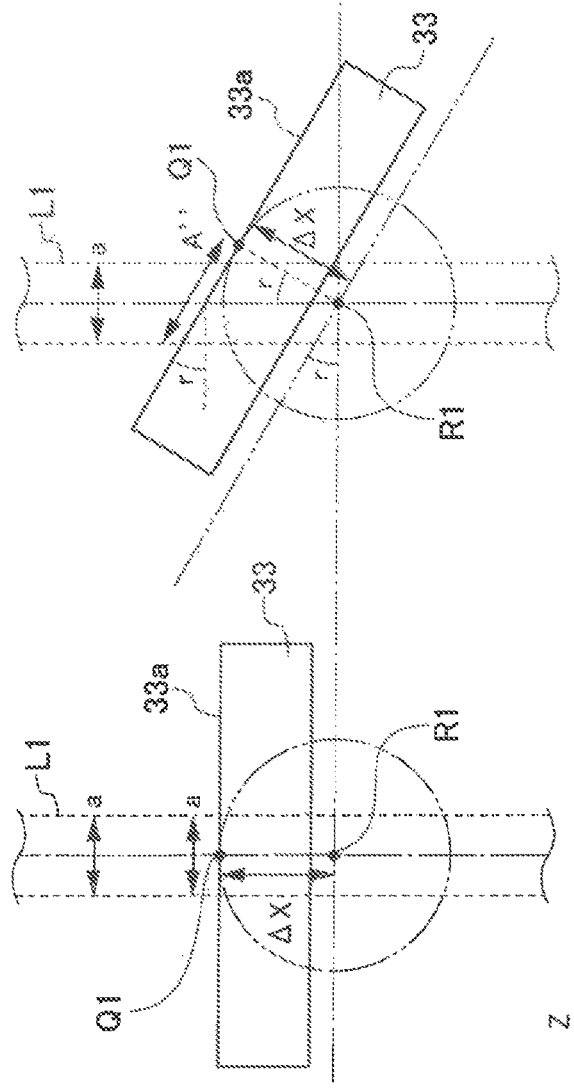

ION MILLING APPARATUS AND SAMPLE HOLDER

CROSS-REFERENCE TO RELATED APPLICATION

This application claims priority to Japanese Patent Application No. 2017-105077 filed May 26, 2017, the disclosure of which is hereby incorporated in its entirety by reference.

BACKGROUND OF THE INVENTION

Field of the Invention

The present invention relates to an ion milling apparatus that is used for producing a sample that is to be observed with a scanning electron microscope, a transmission electron microscope, or the like, and a sample holder that holds a sample.

Description of Related Art

In general, an ion milling apparatus is used to etch, through ion beam irradiation, a sample that is to be observed with an electron microscope such as a scanning electron microscope (SEM) and a transmission electron microscope (TEM), thereby processing the sample into a shape suitable for observation.

An example of such an ion milling apparatus is described in Japanese Unexamined Patent Application Publication No. 2005-91094 (hereinafter referred to as Patent Document 1). According to Patent Document 1, the ion milling apparatus includes a sample holder that holds a sample and a sample stage to which the sample holder is attached. The sample stage is attached to a sample stage extraction mechanism capable of being tilted about a tilt axis.

In the technology described in Patent Document 1, the tilt axis of the sample stage is constantly positioned on the borderline of a sample and a shielding plate. Thus, in the technology described in Patent Document 1, an area of an ion beam with which the sample is irradiated, that is, a process area, depends on the diameter of the ion beam, and it is not possible to increase the irradiation area of the ion beam.

SUMMARY OF THE INVENTION

Considering the aforementioned issue, it is an object of the present invention to provide an ion milling apparatus capable of increasing an area of an ion beam with which a sample is irradiated and a sample holder.

To solve the aforementioned issue and achieve the object of the present invention, the ion milling apparatus according to the present invention includes an ion irradiation source, a sample holder, a sample stage, a rotation mechanism, and a slide mechanism. The ion irradiation source emits an ion beam. The sample holder includes a shielding plate that blocks the ion beam. The sample holder holds a sample such that the sample protrudes from the shielding plate in a direction perpendicular to an optical axis of the ion beam. The sample holder is attached to the sample stage. The rotation mechanism includes a rotation shaft and is disposed such that a rotation center of the rotation shaft is perpendicular to the optical axis of the ion beam and parallel to a direction in which the sample protrudes from the shielding plate. The rotation mechanism supports the sample stage such that the sample stage is rotatable. The slide mechanism supports the sample held by the sample holder such that the sample is movable along the optical axis of the ion beam.

The sample holder according to the present invention includes a sample holding portion, a shielding plate, a holder body, a holder supporting portion, and a holder-side attachment portion. The sample holding portion holds a sample. The shielding plate is disposed at one end of the sample holding portion and covers a portion of a process surface of the sample. The holder body includes the sample holding portion and the shielding plate. The holder supporting portion supports the holder body. The holder-side attachment portion supports the holder supporting portion such that the holder supporting portion is movable. The sample holding portion holds the sample such that a portion of the sample protrudes from the shielding plate. The holder-side attachment portion supports the holder supporting portion such that the holder supporting portion is movable in a direction perpendicular to a direction in which the sample protrudes from the shielding plate and perpendicular to the process surface of the sample.

According to the ion milling apparatus and the sample holder of the present invention, it is possible to increase the area of the ion beam with which the sample is irradiated.

BRIEF DESCRIPTION OF THE DRAWINGS

FIG. 4A is a perspective view illustrating a non-rotated state of the sample holder, and each of FIGS. 4B and 4C is a perspective view illustrating a rotated state of the sample holder.

FIGS. 5A, 5B, and 5C each illustrate an enlargement of a sample and a shielding plate in the states in FIGS. 4A, 4B, and 4C; FIG. 5A is an enlarged view of FIG. 4A, FIG. 5B is an enlarged view of FIG. 4B, and FIG. 5C is an enlarged view of 4C.

FIGS. 6A, 6B, and 6C each schematically illustrate an ion beam irradiation area in the states in FIGS. 4A to 4C and FIGS. 5A to 5C; FIG. 6A is an illustration for FIGS. 4A and 5A, FIG. 6B is an illustration for FIGS. 4B and 5B, and FIG. 6C is an illustration for FIGS. 4C and 5C.

FIGS. 7A and 7B each schematically illustrate a relationship between the sample and the ion beam in the states in FIGS. 4A to 4C, FIGS. 5A to 5C, and FIGS. 6A to 6C; FIG. 7A is an illustration of the relationship between the rotated sample and the ion beam, and FIG. 7B is an illustration of the processed sample.

FIG. 9A is a perspective view illustrating a state in which the sample holder is not rotated, and each of FIGS. 9B and 9C is a perspective view illustrating a state in which the sample holder is rotated.

FIGS. 10A, 10B, and 10C each illustrate an enlargement of the sample and the shielding plate in the states in FIGS. 9A to 9C; FIG. 10A is an enlarged view of FIG. 9A, FIG. 10B is an enlarged view of FIG. 9B, and FIG. 10C is an enlarged view of FIG. 9C.

FIG. 11A is an illustration for FIG. 9A and FIG. 10A, FIG. 11B is an illustration for FIG. 9B and FIG. 10B, and FIG. 11C is an illustration for FIG. 9C and FIG. 10C.

FIGS. 12A and 12B each schematically illustrate a relationship between the sample and the ion beam in the states in FIGS. 9A to 9C, FIGS. 10A to 10C, and FIGS. 11A to 11C; FIG. 12A is an illustration of the relationship between the rotated sample and the ion beam, and FIG. 12B is an illustration of the processed sample.

FIGS. 13A, 13B, and 13C each illustrates a state in which the sample is moved in a direction approaching the ion irradiation source in the ion milling apparatus according to the first embodiment of the present invention; FIG. 13A is a perspective view illustrating a state in which the sample holder is not rotated, and each of FIGS. 13B and 13C is a perspective view illustrating a state in which the sample holder is rotated.

FIGS. 14A, 14B, and 14C each illustrate an enlargement of the sample and the shielding plate in the states in FIGS. 13A to 13C; FIG. 14A is an enlarged view of FIG. 13A, FIG. 14B is an enlarged view of FIG. 13B, and FIG. 14C is an enlarged view of FIG. 13C.

FIGS. 15A, 15B, and 15C each schematically illustrate an ion beam irradiation area in the states in FIGS. 13A to 13C and FIGS. 14A to 14C; FIG. 15A is an illustration for FIGS. 13A and 14A, FIG. 15B is an illustration for FIGS. 13B and 14B, and FIG. 15C is an illustration for FIGS. 13C and 14C.

FIG. 17A is a perspective view illustrating a state in which the sample holder is unmoved, FIG. 17B is a perspective view illustrating a state in which the sample holder is moved in a direction away from the ion irradiation source, and FIG. 17C is a perspective view illustrating a state in which the sample holder is moved in a direction approaching the ion irradiation source.

DESCRIPTION OF THE INVENTION

Figure 1:
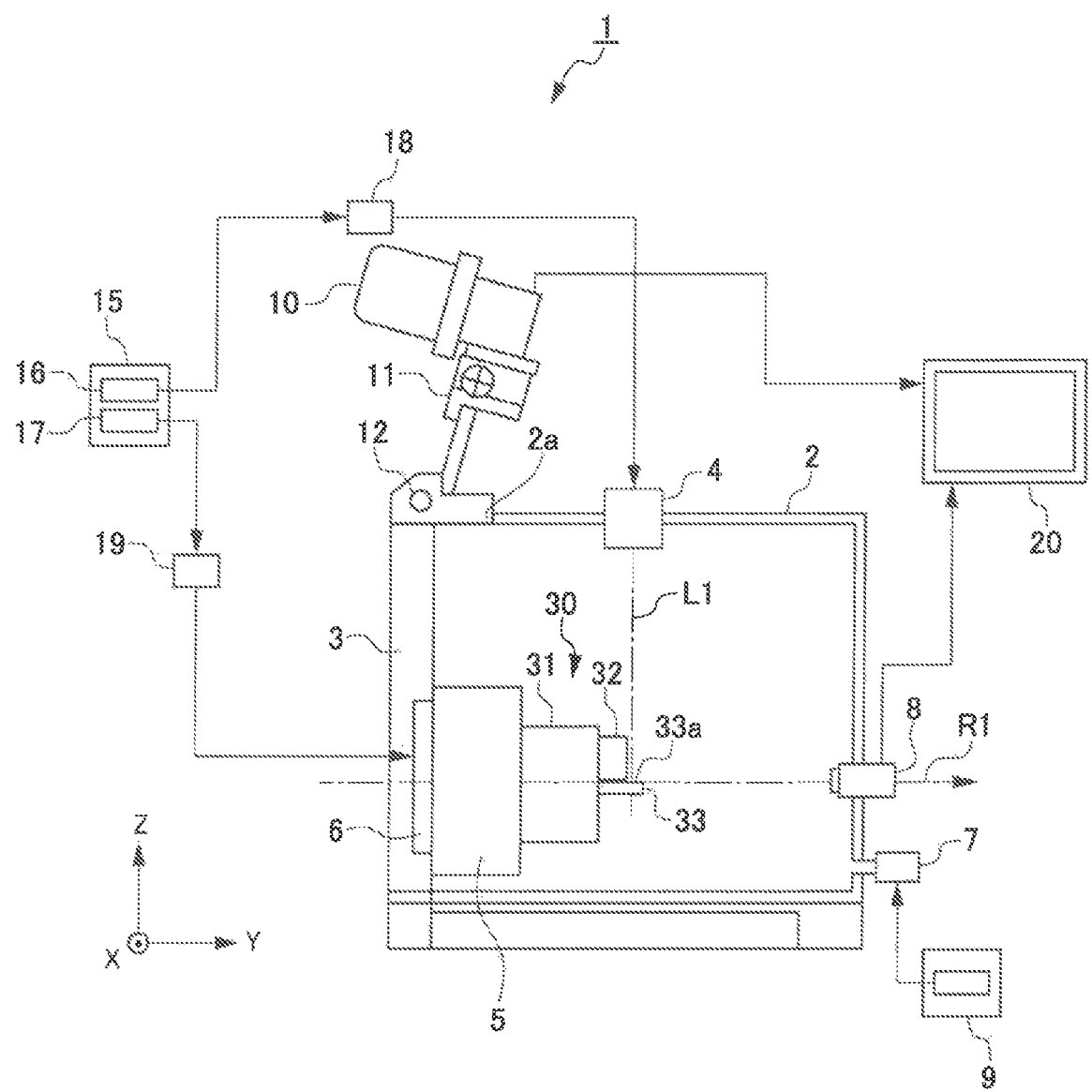
FIG. 1 is a schematic block diagram illustrating an ion milling apparatus according to a first embodiment of the present invention.

Hereinafter, embodiments of an ion milling apparatus and a sample holder according to the present invention will be described with reference to FIG. 1 to FIG. 17C. Note that members common between drawings are given the same reference characters.

1. First Embodiment 1-1. Configuration of Ion Milling Apparatus

First, an ion milling apparatus according to a first embodiment (hereinafter referred to as "the present embodiment") of the present invention will be described with reference to FIG. 1.

FIG. 1 is a schematic block diagram of the ion milling apparatus according to the present embodiment.

The apparatus illustrated in FIG. 1 is an ion milling apparatus that produces a sample to be observed with a scanning electron microscope (SEM) or a transmission electron microscope (TEM). An ion milling apparatus 1 is configured to etch a sample 33 by irradiating the sample 33 with an ion beam to thereby process the sample 33 into a shape suitable for observation with an SEM and a TEM.

As illustrated in FIG. 1, the ion milling apparatus 1 includes a vacuum chamber 2, a sample stage extraction mechanism 3, an ion irradiation source 4, a sample stage 5, a rotation mechanism 6, an exhaust unit 7, a process observation camera 8, a vacuum exhaustion drive unit 9, a positioning camera 10, and a control unit 15. In addition, the ion milling apparatus 1 includes a voltage power source 18, a rotation mechanism drive unit 19, and a display device 20.

The vacuum chamber 2 is a hollow container. The vacuum chamber 2 has a surface having an open portion 2a. The exhaust unit 7 is connected to the vacuum chamber 2. The exhaust unit 7 is driven by the vacuum exhaustion drive unit 9. Driving the exhaust unit 7 causes an air in an internal space of the vacuum chamber 2 to be exhausted.

The sample stage extraction mechanism 3 is attached so as to openably close the open portion 2a of the vacuum chamber 2. The rotation mechanism 6 and the sample stage 5 are disposed on the sample stage extraction mechanism 3.

The sample stage 5 is rotatably supported by the rotation mechanism 6. The rotation mechanism 6 is driven to rotate by the rotation mechanism drive unit 19. The sample stage 5 is stored in the internal space of the vacuum chamber 2. A sample holder 30 that holds the sample 33 is detachably attached to the sample stage 5. The sample holder 30 includes a shielding plate 32 that blocks an ion beam L1. Detailed configurations of the rotation mechanism 6, the sample stage 5, and the sample holder 30 will be described later.

The process observation camera 8 is disposed on a wall surface of the vacuum chamber 2 opposite the sample stage 5. The process observation camera 8 images the sample 33 that is held by the sample holder 30 attached to the sample stage 5. The process observation camera 8 is connected to the display device 20. The display device 20 displays an image imaged by the process observation camera 8.

The ion irradiation source 4 is disposed at an upper part of the vacuum chamber 2. The ion irradiation source 4 is, for example, a gas ion gun that discharges an argon ion (ion beam L1) by ionizing an argon gas by electric discharge. The ion irradiation source 4 emits the ion beam L1 toward the internal space of the vacuum chamber 2.

Hereinafter, a direction perpendicular to an optical axis of the ion beam L1 is referred to as a first direction X and a second direction Y. The second direction Y is a direction in which the sample 33 held by the sample holder 30 protrudes from the shielding plate 32. The first direction X is a direction perpendicular to the second direction Y. A direction perpendicular to each of the first direction X and the second direction Y and parallel to the optical axis of the ion beam L1 is referred to as a third direction Z.

The voltage power source 18 is connected to the ion irradiation source 4. The voltage power source 18 applies a voltage to the ion irradiation source 4. The voltage power source 18 is controlled by an ion irradiation source controller 16 included in the control unit 15.

In addition, the control unit 15 includes a rotation mechanism controller 17. The rotation mechanism controller 17 is connected to the rotation mechanism drive unit 19. The rotation mechanism controller 17 controls driving of the rotation mechanism 6 by controlling the rotation mechanism drive unit 19.

The positioning camera 10 is disposed at an upper end of the sample stage extraction mechanism 3 via a camera rotation mechanism 12. The positioning camera 10 is rotatably supported at an upper portion of the sample stage extraction mechanism 3 by the camera rotation mechanism 12. When the camera rotation mechanism 12 is rotated, the positioning camera 10 is positioned opposite, in the third direction Z, the sample holder 30 attached to the sample stage 5.

The positioning camera 10 images the shielding plate 32 and the sample 33 held by the sample holder 30. The positioning camera 10 is also connected to the display device 20 as is the process observation camera 8. The display device 20 displays an image imaged by the positioning camera 10. Consequently, it is possible to visually recognize a protruding degree of the sample 33 from the shielding plate 32.

A camera position adjustment mechanism 11 is disposed on the camera rotation mechanism 12. The camera position adjustment mechanism 11 adjusts a position of the positioning camera 10.

Next, the sample stage 5 and the rotation mechanism 6 will be described with reference to FIG. 2.

Figure 2:
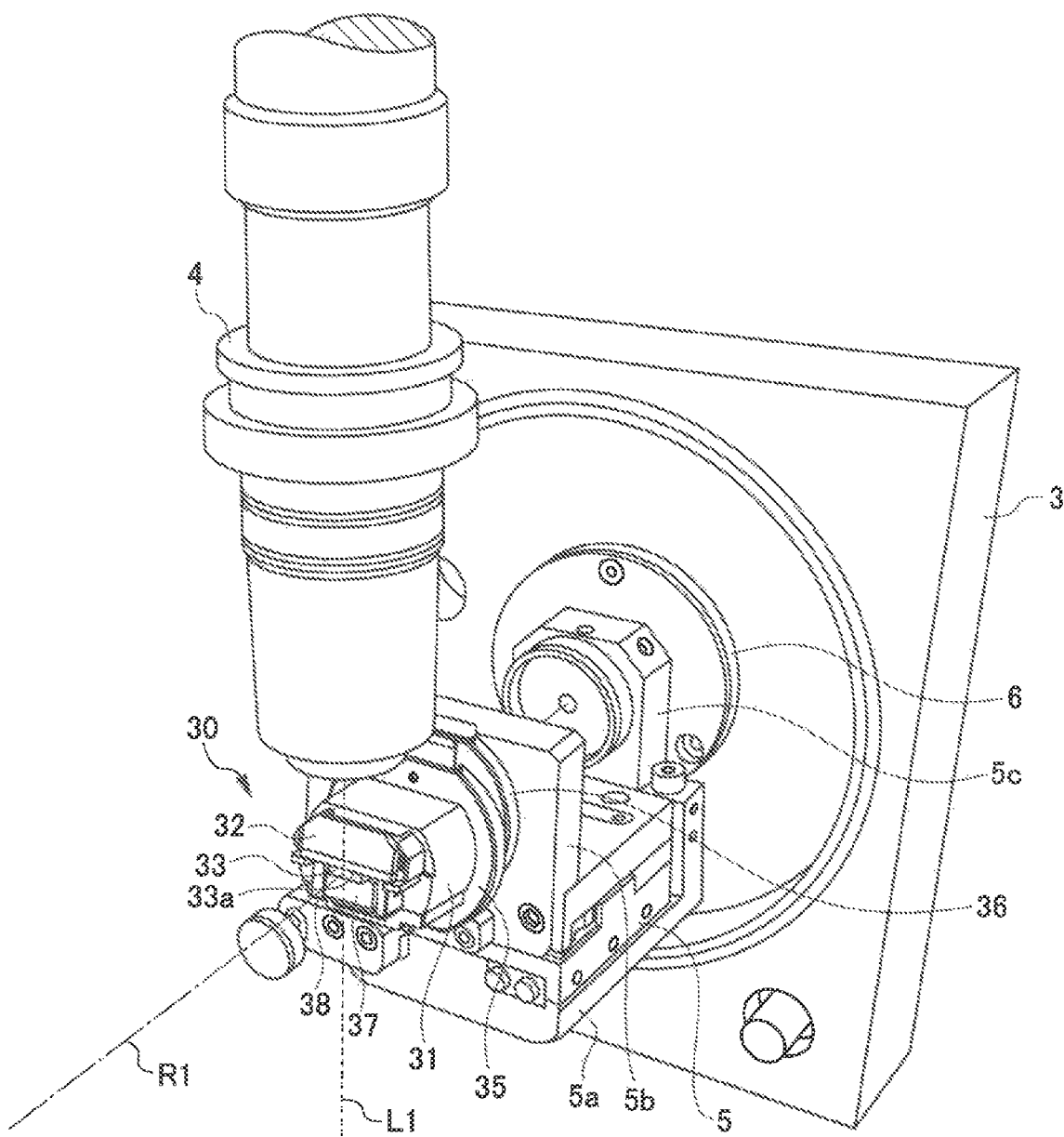
FIG. 2 is a perspective view around a sample stage of the ion milling apparatus according to the first embodiment of the present invention.

FIG. 2 is a perspective view around the sample stage 5.

As illustrated in FIG. 2, the rotation mechanism 6 is disposed on a surface of the sample stage extraction mechanism 3, the surface being parallel to the first direction X and the second direction Y. As described above, the rotation mechanism 6 is rotated by the rotation mechanism drive unit 19 (refer to FIG. 1). The sample stage 5 is disposed on a rotation shaft of the rotation mechanism 6. The rotation shaft of the rotation mechanism 6 has a rotation center R1 parallel to the second direction Y. Therefore, the rotation center R1 of the rotation mechanism 6 is perpendicular to the optical axis of the ion beam L1 and also perpendicular to the first direction X.

The sample stage 5 includes a sample position adjustment mechanism 5a, an attachment portion 5b to which the sample holder 30 is detachably attached, and a rotation support portion 5c. The rotation support portion 5c is fixed to the rotation shaft of the rotation mechanism 6. The rotation support portion 5c is rotated together with the rotation shaft of the rotation mechanism 6.

The sample position adjustment mechanism 5a is disposed on the rotation support portion 5c. The sample position adjustment mechanism 5a protrudes from the rotation support portion 5c in the second direction Y. The sample position adjustment mechanism 5a includes a supporting base and a moving base that is movably supported by the supporting base. The moving base is supported by the supporting base so as to be movable in the first direction X and the second direction Y. The attachment portion 5b is disposed on the moving base of the sample position adjustment mechanism 5a.

The attachment portion 5b extends vertically in the third direction Z from the sample position adjustment mechanism 5a. The attachment portion 5b has a substantially flat plate shape. One surface of the attachment portion 5b faces the side opposite to the sample stage extraction mechanism 3 in the second direction Y. The sample holder 30 is detachably attached to the one surface of the attachment portion 5b. Consequently, when the sample stage 5 is rotated by the rotation mechanism 6, the sample holder 30 is also rotated together with the sample stage 5.

1-2. Configuration of Sample Holder

Next, a configuration of the sample holder 30 will be described with reference to FIG. 3.

Figure 3:
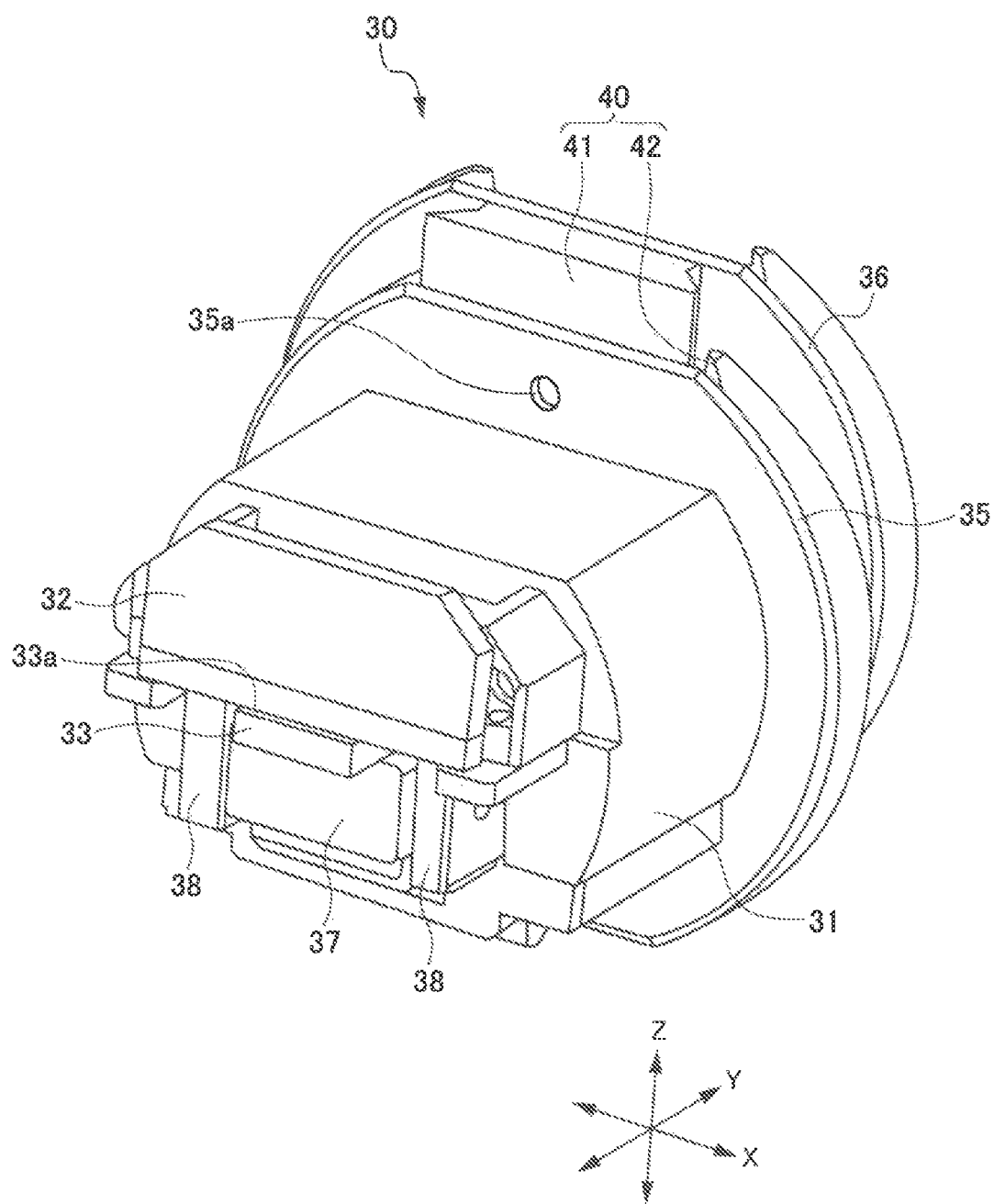
FIG. 3 is a perspective view of a sample holder according to the first embodiment of the present invention.

FIG. 3 is a perspective view of the sample holder 30.

As illustrated in FIG. 3, the sample holder 30 includes a holder body 31, the shielding plate 32, a holder supporting portion 35, a holder-side attachment portion 36, a sample placement base 37, and sample holding portions 38. The sample holder 30 is provided with a slide mechanism 40 that is constituted by a guide rail 41 and a slide groove 42.

The guide rail 41 constituting the slide mechanism 40 is disposed on the holder-side attachment portion 36. The guide rail 41 is disposed on one surface of the holder-side attachment portion 36 facing the side opposite to the attachment portion 5b in the second direction Y. The guide rail 41 extends between one end portion and the other end portion of the holder-side attachment portion 36 in the third direction Z. The slide groove 42 disposed on the holder supporting portion 35 is slidably engaged with the guide rail 41.

The slide groove 42 extends between one end portion and the other end portion of the holder supporting portion 35 in the third direction Z. The slide groove 42 is disposed on a surface of the holder supporting portion 35 facing the holder-side attachment portion 36. The holder supporting portion 35 is supported by the holder-side attachment portion 36 so as to be movable in the third direction Z. That is, the holder supporting portion 35 constitutes a slide member of the slide mechanism 40.

The holder supporting portion 35 has a holding hole 35a. The holding hole 35a extends between one surface and the other surface of the holder supporting portion 35 in the second direction Y. A holding screw (not illustrated) is fastened and fixed to the holding hole 35a.

Fastening and fixing the holding screw to the holding hole 35a causes the holder supporting portion 35 to be held at an optional position in the third direction Z of the holder-side attachment portion 36. The guide rail 41 may be provided with a scale to enable visual recognition of a movement amount of the holder supporting portion 35.

The structure for holding the holder supporting portion 35 at the holder-side attachment portion 36 is not limited to the holding screw. For example, the holder supporting portion 35 may be held at the holder-side attachment portion 36 by inserting a holding pin into the holding hole 35a of the holder supporting portion 35 and into one of a plurality of holder-side holding holes formed along the third direction Z in the guide rail 41.

Moreover, the structure for holding the holder supporting portion 35 at the holder-side attachment portion 36 is not limited to the holding screw and the holding pins; other various structures, such as engagement and fitting, may be applicable thereto.

The holder body 31 is disposed on one surface of the holder supporting portion 35 facing the side opposite to the holder-side attachment portion 36. The holder body 31 protrudes from the holder supporting portion 35 toward one side in the second direction Y. The shielding plate 32 is fixed to an end portion, that is, one end portion in the second direction Y, of the holder body 31, the end portion facing the side opposite to the holder supporting portion 35. The shielding plate 32 is formed of a material that has a higher strength with respect to the ion beam L1 than the sample 33. The shielding plate 32 blocks the ion beam L1 emitted from the ion irradiation source 4.

The sample placement base 37 and the sample holding portions 38 are disposed on the holder body 31 so as to be on the other side, that is, on the downstream of the optical axis of the ion beam L1, of the shielding plate 32 in the third direction Z. The sample placement base 37 is spaced from the shielding plate 32 in the third direction Z. The sample 33 is placed on the sample placement base 37. The sample placement base 37 is disposed such that one surface thereof on which the sample 33 is placed is parallel to the first direction X and the second direction Y.

As illustrated in FIG. 2, one surface in the third direction Z of the sample 33 placed on the sample placement base 37 is a process surface 33a. The process surface 33a faces, in the third direction Z, the ion beam L1 emitted from the ion irradiation source 4. The process surface 33a is irradiated with the ion beam L1.

When the sample 33 is placed on the sample placement base 37, a portion of the process surface 33a is covered by the shielding plate 32. The portion of the process surface 33a covered by the shielding plate 32 remains without being etched by the ion beam L1. A region of the sample 33 protruding from the shielding plate 32 in the second direction Y is subjected to etching by the ion beam.

The sample 33 placed on the sample placement base 37 is held between the sample placement base 37 and the shielding plate 32. The sample placement base 37 presses the sample 33 toward the shielding plate 32. As a result, the sample 33 and the shielding plate 32 come into close contact with each other to eliminate a gap between the sample 33 and the shielding plate 32. Consequently, it is possible to prevent a process defect from occurring when performing an etching process by irradiating the sample 33 with the ion beam L1.

As illustrated in FIG. 3, the sample holding portions 38 are disposed on both sides in the first direction X of the sample placement base 37. The sample holding portions 38 hold, from the both sides in the first direction X, the sample 33 placed on the sample placement base 37. The sample placement base 37 and the sample holding portions 38 cause the sample 33 to be disposed such that the process surface 33a is parallel to the first direction X and the second direction Y.

The holder body 31 is provided with a process position adjustment mechanism (not illustrated) that moves the sample holding portions 38 in the first direction X and the second direction Y. The sample holding portions 38 are moved in the first direction X and the second direction Y while holding the sample 33. As a result, it is possible to adjust the protruding degree in the second direction Y of the sample 33 from the shielding plate 32.

An example in which the sample 33 is movable in the first direction X and the second direction Y is described for the sample holder 30 according to the present embodiment; however, the sample holder 30 is not limited thereto. The sample holder 30 may have a configuration in which the sample 33 is movable only in the second direction Y to adjust the protruding degree.

An example in which the slide groove 42 is disposed, as the slide mechanism 40, on the holder supporting portion 35 and the guide rail 41 is disposed on the holder-side attachment portion 36 is described for the sample holder 30 according to the present embodiment; however, the sample holder 30 is not limited thereto. For example, the slide groove 42 may be disposed on the holder-side attachment portion 36, and the guide rail 41 that slides along the slide groove 42 may be disposed on the holder supporting portion 35.

1-3. Example of Operation of Ion Milling Apparatus

Next, an example of operation of the ion milling apparatus 1 that has the aforementioned configuration will be described with reference to FIG. 4A to FIG. 16.

Figure 4A:
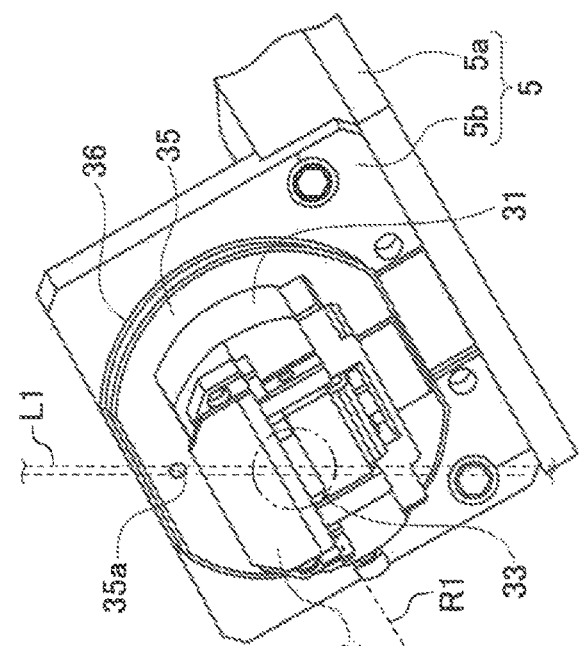
FIGS. 4A, 4B, and 4C each illustrate operation of the ion milling apparatus according to the first embodiment of the present invention.
Figure 4B:
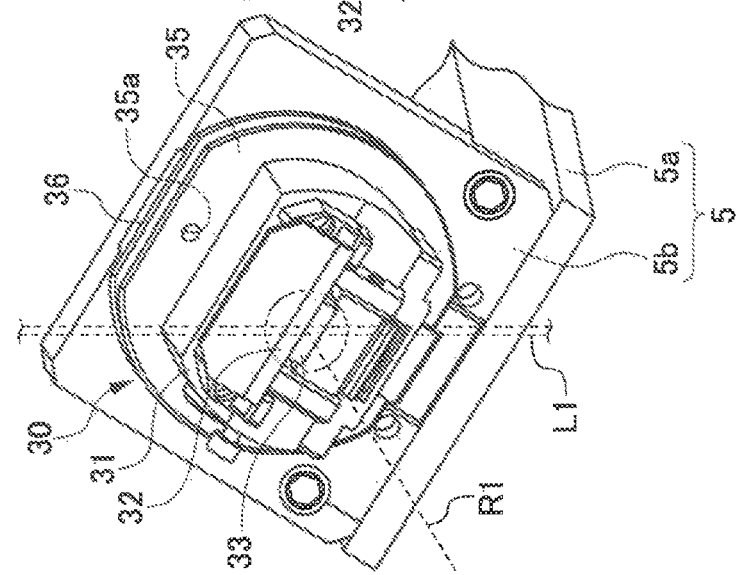
Figure 4C:
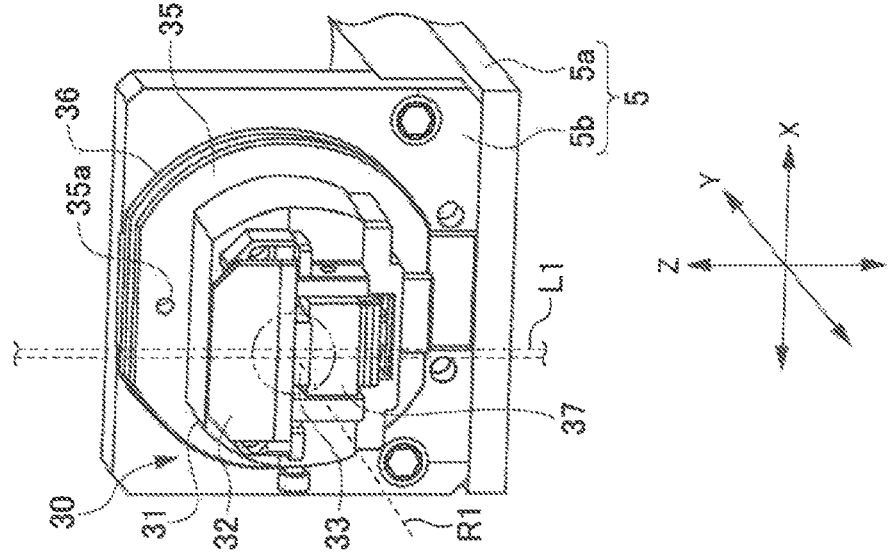

First, with reference to FIGS. 4A to 7B, a state in which the holder supporting portion 35 is unmoved will be described. Each of FIGS. 4A to 4C is a perspective view of the sample holder 30 when the sample 33 is irradiated with the ion beam L1. FIGS. 5A to 5C are enlarged views of FIGS. 4A to 4C. Each of FIGS. 6A to 6C is a schematic illustration of an irradiation area of the ion beam L1. Each of FIGS. 7A and 7B is a schematic illustration of a relationship between the sample 33 and the ion beam L1.

As illustrated in each of FIG. 4A and FIG. 5A, in a state in which the holder supporting portion 35 is unmoved, the rotation center R1 of the rotation mechanism 6 passes the borderline, that is, on the process surface 33a, between the sample 33 held by the sample holder 30 and the shielding plate 32. As illustrated in FIG. 6A, the rotation center R1 coincides with a process center Q1 of the process surface 33a of the sample 33. A length a of the irradiation area in the first direction X of the ion beam L1 coincides with a beam diameter a of the ion beam L1.

As illustrated in FIGS. 4B, 4C, 5B, and 5C, when the rotation mechanism 6 is driven in a state in which the holder supporting portion 35 is unmoved, the sample holder 30 and the sample stage 5 are rotated about the rotation center R1. The center of the optical axis of the ion beam L1 passes the process center Q1 of the process surface 33a because the rotation center R1 coincides with the process center Q1 of the process surface 33a.

When the sample holder 30 and the sample stage 5 are rotated about the rotation center R1 by an angle r, the process surface 33a of the sample 33 is tilted at the angle r in the first direction X. At this time, when the beam diameter of the ion beam L1 is represented by a, a length A of the irradiation area in the first direction X of the ion beam L1 is calculated by the following formula (Formula 1).

$$A = \left(\frac{1}{2} a \times \frac{1}{\cos r}\right) \times 2 = \frac{a}{\cos r}$$

Thus, as illustrated in FIGS. 7A and 7B, when the sample 33 is tilted in a state in which the rotation center R1 is positioned on the process surface 33a, the length in the first direction X of a processed sectional surface T1 formed on the sample 33 is the length A of the irradiation area of the ion beam L1 calculated by Formula 1.

Next, with reference to FIGS. 8 to 12B, an example in which the holder supporting portion 35 is moved in a direction away from the ion irradiation source 4 will be described.

Figure 8:
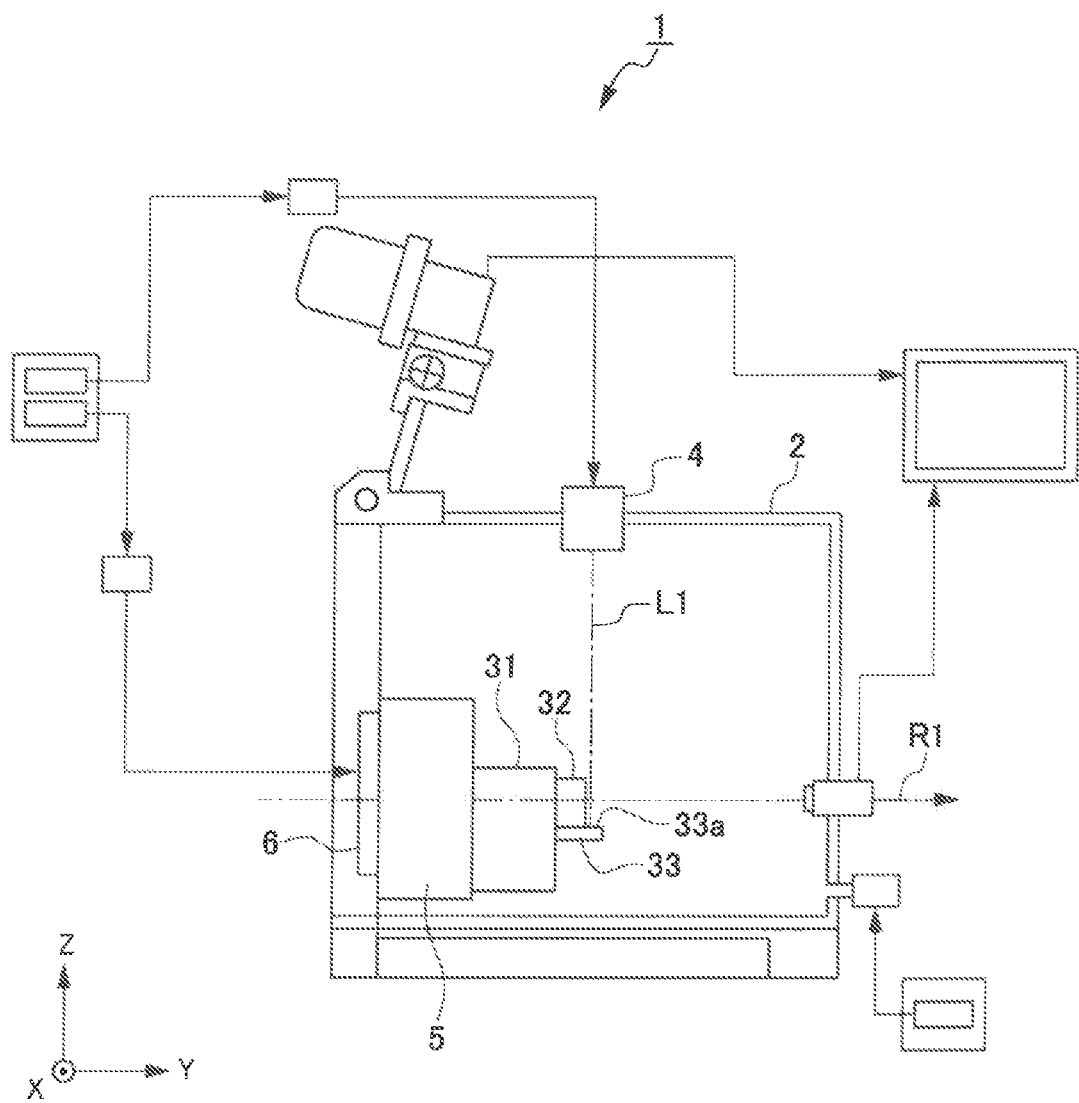
FIG. 8 is a schematic block diagram illustrating a state in which a sample is moved in a direction away from an ion irradiation source in the ion milling apparatus according to the first embodiment of the present invention.
Figure 9A:
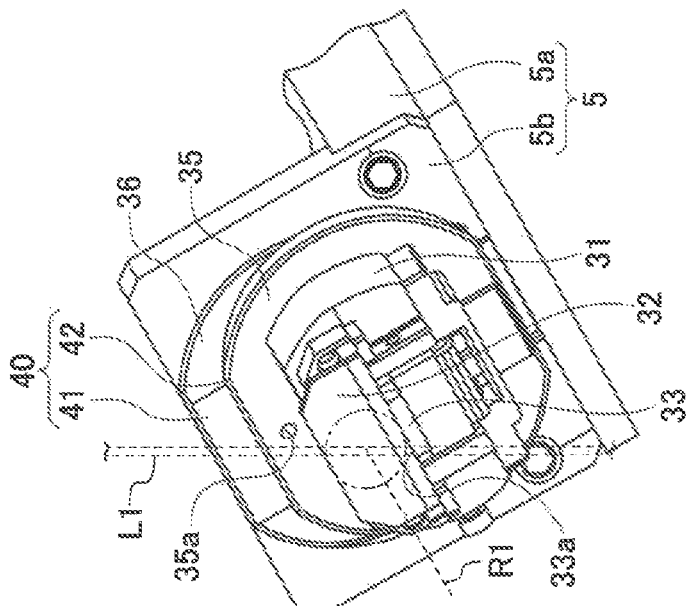
FIGS. 9A, 9B, and 9C each illustrate a state in which a sample is moved in a direction away from the ion irradiation source in the ion milling apparatus according to the first embodiment of the present invention.
Figure 9B:
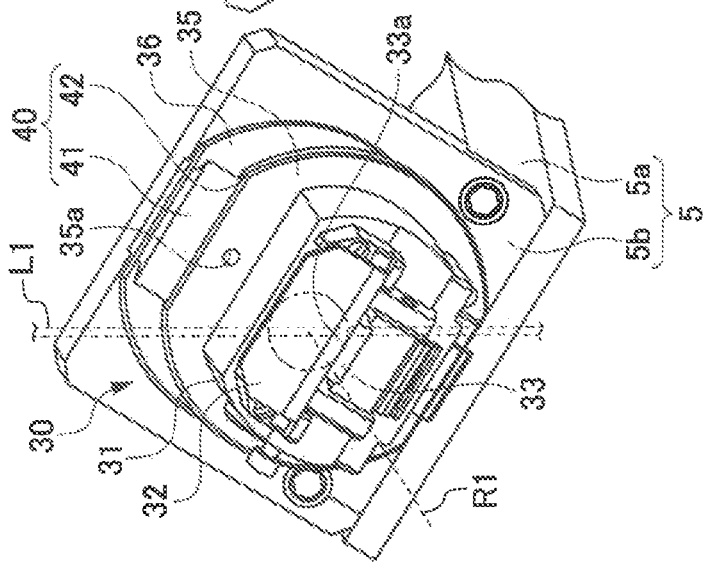
Figure 9C:
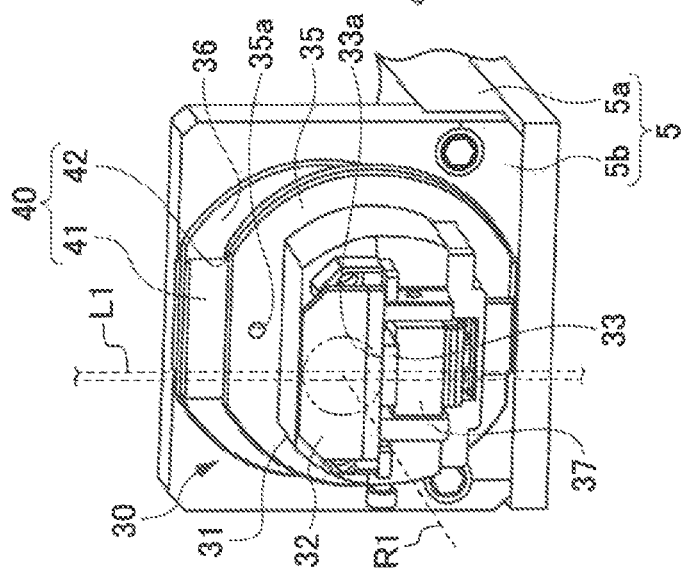
Figure 11A:
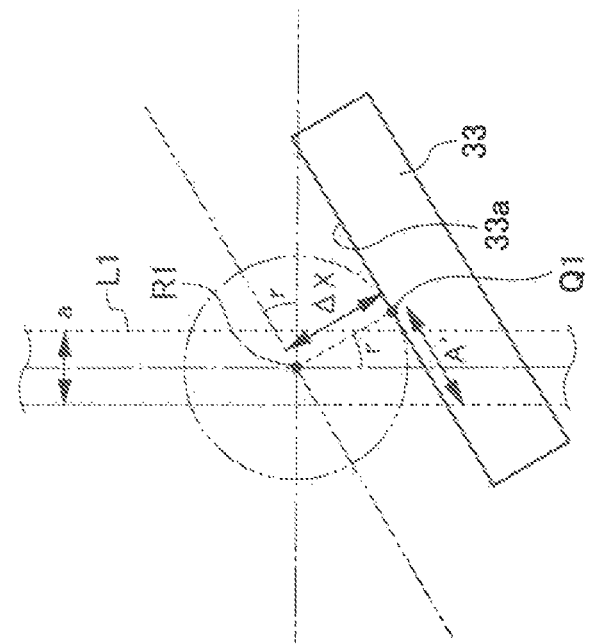
FIGS. 11A, 11B, and 11C each schematically illustrate an ion beam irradiation area in the states in FIGS. 9A to 9C and FIGS. 10A to 10C.
Figure 11B:
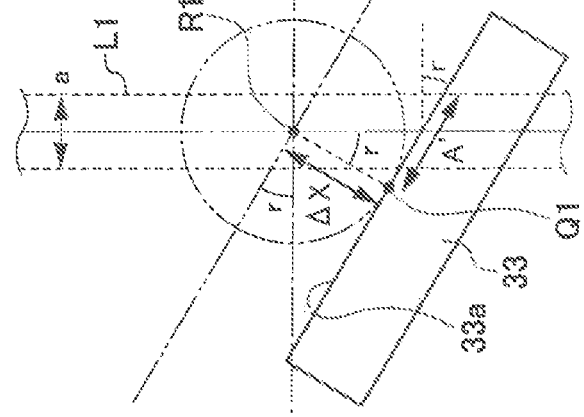
Figure 11C:
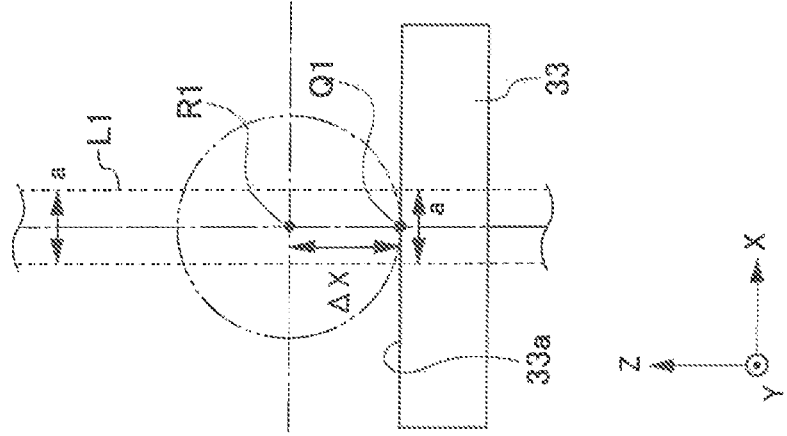

FIG. 8 is a schematic block diagram illustrating a state in which the sample 33 is moved. Each of FIGS. 9A to 9C is a perspective view of the sample holder 30 when the sample 33 is irradiated with the ion beam L1. FIGS. 10A to 10C are enlarged views of FIGS. 9A to 9C. Each of FIGS. 11A to 11C is a schematic illustration of the irradiation area of the ion beam L1. Each of FIGS. 12A and 12B is a schematic illustration of a relationship between the sample 33 and the ion beam L1.

As illustrated in FIGS. 8 and 9A, the holder supporting portion 35 is moved along the third direction Z via the slide mechanism 40 in a direction away from the ion irradiation source 4. Namely, after the holding screw fixed to the holding hole 35a is loosened and the holder supporting portion 35 is moved to a predetermined position, the holding screw is fastened and fixed to the holding hole 35a again.

Consequently, the shielding plate 32 and the sample 33 held by the sample holder 30 are also moved in the direction away from the ion irradiation source 4. Thus, as illustrated in FIG. 10A, the process surface 33a of the sample 33 is separated from the rotation center R1 toward the other side in the third direction Z. As illustrated in FIG. 11A, in a state in which the rotation mechanism 6 is unmoved, the length a in the first direction X of the irradiation area of the ion beam L1 coincides with the beam diameter a of the ion beam L1.

The sample 33 is, however, disposed at a position away from the ion irradiation source 4 further than in the state illustrated in each of FIGS. 4A, 5A, and 6A. Thus, it is possible to reduce the intensity of ion beam L1 with which the sample 33 is irradiated. Consequently, fine adjustment of a processed sectional surface formed on the sample 33 is enabled.

As illustrated in FIGS. 9B, 9C, 10B, and 10C, when the rotation mechanism 6 is driven, the sample holder 30 and the sample stage 5 are rotated about the rotation center R1. In addition, it is possible to increase a length A' from the process center Q1, of the irradiation area of the ion beam L1 because the process center Q1 of the process surface 33a is away from the rotation center R1, as illustrated in FIGS. 11B and 11C.

When the sample holder 30 and the sample stage 5 are rotated about the rotation center R1 by the angle r, the process surface 33a of the sample 33 is tilted in the first direction X at the angle r. When the distance between the process center Q1 of the process surface 33a and the rotation center R1 is represented by ΔX, and the beam diameter of the ion beam L1 is represented by a, a length 2A' of the irradiation area in the first direction X of the ion beam L1 is calculated by the following formula (Formula 2).

$$2A' = 2\left(\Delta X \tan r + \frac{a}{2\cos r}\right) = 2 \cdot \frac{2\Delta X \sin r + a}{2\cos r} = \frac{2\Delta X \sin r + a}{2\cos r}$$

As illustrated in FIGS. 11B and 11C, the sample holder 30 and the sample stage 5 are rotated about the rotation center R1 clockwise and counterclockwise each by the angle r. Thus, the length 2A' in the first direction X of the irradiation area of the ion beam L1 is equal to twice the length A' from the process center Q1, of the irradiation area of the ion beam L1.

As illustrated in FIGS. 12A and 12B, when the sample 33 is tilted in a state in which the holder supporting portion 35 is moved and the rotation center R1 is away from the process surface 33a, the length in the first direction X of a processed sectional surface T2 formed on the sample 33 is the length 2A' of the irradiation area of the ion beam L1 calculated by Formula 2. Consequently, it is possible to increase the irradiation area of the ion beam L1 and to increase the process area of the sample 33.

Next, with reference to FIGS. 13A to 15C, a state in which the holder supporting portion 35 is moved in a direction approaching the ion irradiation source 4 will be described.

Each of FIGS. 13A to 13C is a perspective view of the sample holder 30 when the sample 33 is irradiated with the ion beam L1. FIGS. 14A to 14C are enlarged views of FIGS. 13A to 13C. Each of FIGS. 15A to 15C is a schematic illustration of the irradiation area of the ion beam L1.

As illustrated in FIG. 13A, the holder supporting portion 35 is moved along the third direction Z via the slide mechanism 40 in a direction approaching the ion irradiation source 4. Namely, after the holding screw fixed to the holding hole 35a is loosened and the holder supporting portion 35 is moved to a predetermined position, the holding screw is fastened and fixed to the holding hole 35a again.

Consequently, the shielding plate 32 and the sample 33 held by the sample holder 30 are also moved in the direction approaching the ion irradiation source 4. Thus, as illustrated in FIG. 14A, the process surface 33a of the sample 33 is separated from the rotation center R1 toward one side in the third direction Z. As illustrated in FIG. 15A, in a state in which the rotation mechanism 6 is not rotated, the length a in the first direction X of the irradiation area of the ion beam L1 coincides with the beam diameter a of the ion beam L1.

The sample 33 is, however, disposed at a position closer than in the state illustrated in each of FIGS. 4A, 5A, and 6A to the ion irradiation source 4. Thus, it is possible to increase the intensity of the ion beam L1 with which the sample 33 is irradiated. Consequently, a reduction in a time required for an etching process using the ion beam L1 is enabled.

As illustrated in FIGS. 13B, 13C, 14B, and 14C, when the rotation mechanism 6 is driven, the sample holder 30 and the sample stage 5 are rotated about the rotation center R1. As illustrated in FIGS. 15B and 15C, the process center Q1 of the process surface 33a is away from the rotation center R1; thus, it is possible to increase the length A" from the process center Q1, of the irradiation area of the ion beam L1.

When the sample holder 30 and the sample stage 5 are rotated about the rotation center R1 by the angle r, the process surface 33a of the sample 33 is tilted in the first direction X at the angle r. When the distance between the process center Q1 of the process surface 33a and the rotation center R1 is represented by ΔX, and the beam diameter of the ion beam L1 is represented by a, a length 2A" in the first direction X of the irradiation area of the ion beam L1 is calculated similarly to the length 2A' calculated by Formula 2.

Next, the relationship between the irradiation area of the ion beam L1 and the distance between the rotation center R1 and the process surface 33a will be described with reference to FIG. 16.

Figure 16:
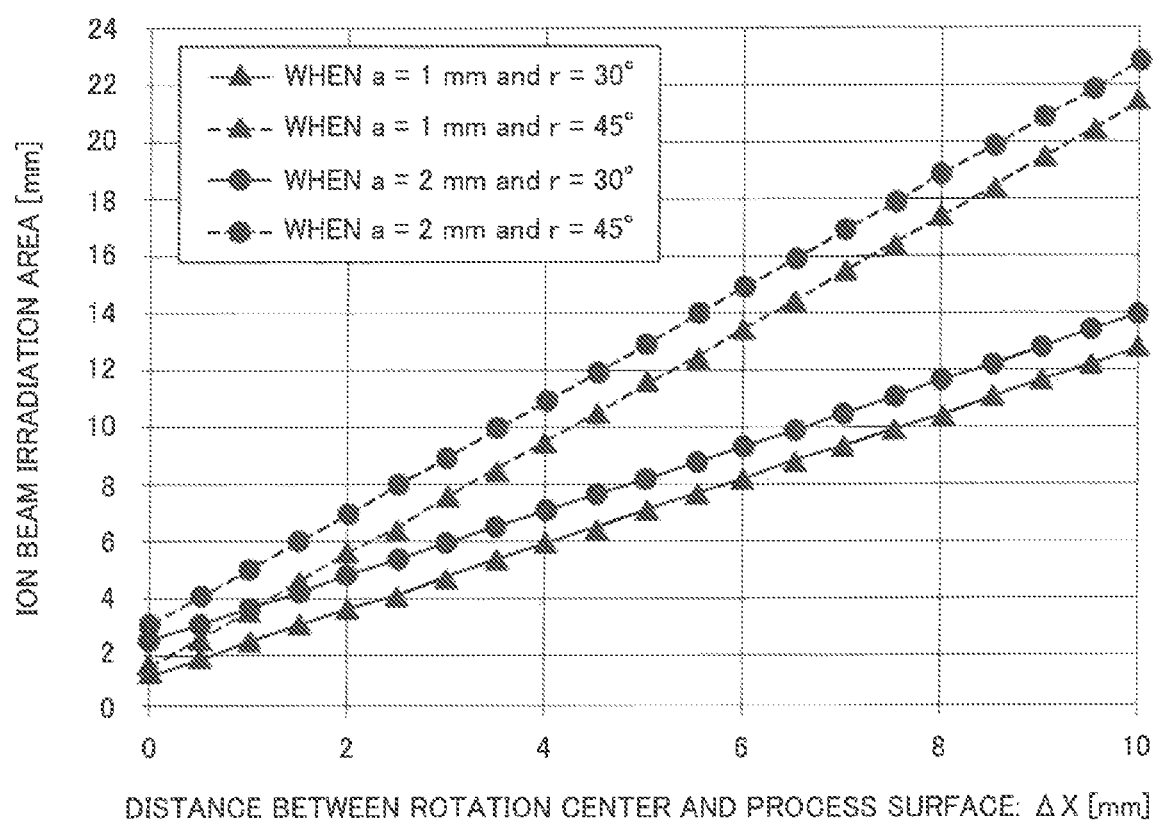
FIG. 16 is a graph showing a relationship between an ion beam irradiation area and a distance between a rotation center of a rotation shaft and a process surface.

FIG. 16 is a graph showing the relationship between the irradiation area of the ion beam L1 and the distance between the rotation center R1 and the process surface 33a. The vertical axis indicates the irradiation area of the ion beam L1, and the horizontal axis indicates the distance ΔX between the rotation center R1 and the process surface 33a. The graph shows a case in which the beam diameter a of the ion beam L1 is 1 mm and an inclination angle r in the first direction X of the sample 33 is 30°, a case in which the beam diameter a is 1 mm and the inclination angle r is 45°, a case in which the beam diameter a is 2 mm and the inclination angle r is 30°, and a case in which the beam diameter a is 2 mm and the inclination angle r is 45°.

FIG. 16 shows that in the case in which the beam diameter a of the ion beam L1 is 1 mm and the inclination angle r is 30°, the distance ΔX between the rotation center R1 and the process surface 33a is 1 mm, and the irradiation area of the ion beam L1 is increased twice. Further, FIG. 16 shows that the irradiation area of the ion beam L1 is increased three times in the case in which the distance ΔX is 2 mm, increased four times in the case in which the distance ΔX is 3 mm, and increased five times in the case in which the distance ΔX is 4 mm.

Thus, it is possible to increase the irradiation area of the ion beam L1 by moving the holder supporting portion 35 via the slide mechanism 40 in the third direction Z, that is, along the optical axis of the ion beam L1 to thereby separate the sample 33 from the rotation center R1. As a result, it is possible to increase the process area, which enables an increase in the length in the first direction X of the processed sectional surface T1 formed on the sample 33.

Moreover, it is possible to control the intensity of the ion beam L1 with which the sample 33 is irradiated by causing the sample 33 to approach or be separated from the ion irradiation source 4. For example, in the initial stage of processing, the sample 33 is caused to approach the ion irradiation source 4 so that the intensity of the ion beam L1 with which the sample 33 is irradiated is increased. Consequently, it is possible to increase the processing speed of etching. In the finishing stage of the etching, the sample 33 is separated from the ion irradiation source 4 so that the intensity of the ion beam L1 with which the sample 33 is irradiated is reduced. Consequently, fine adjustment of a processed sectional surface formed on the sample 33 is enabled.

If the distance ΔX between the rotation center R1 and the process center Q1 of the process surface 33a is constant, the irradiation area of the ion beam L1 is constant, as indicated by Formula 2, even when the sample 33 is moved to the one side (approach the ion irradiation source 4) in the third direction Z or to the other side (away from the ion irradiation source 4) in the third direction Z. Thus, when the distance ΔX between the rotation center R1 and the process center Q1 of the process surface 33a is set to be the same between the initial stage of processing and the finishing stage of the processing, finishing is enabled to be performed with the same irradiation area of the ion beam L1 as that in the initial stage of the processing.

In addition, in the ion milling apparatus 1 according to the first embodiment, the sample holder 30 is provided with the slide mechanism 40. Therefore, even when the sample holder 30 of the present embodiment is attached to an existing ion milling apparatus, it is possible to move the sample 33 in the third direction Z by moving the holder supporting portion 35 of the sample holder 30, which enables an increase in the irradiation area of the ion beam L1.

2. Second Embodiment

Next, with reference to FIGS. 17A, 17B, and 17C, an ion milling apparatus according to a second embodiment will be described.

Figure 17A:
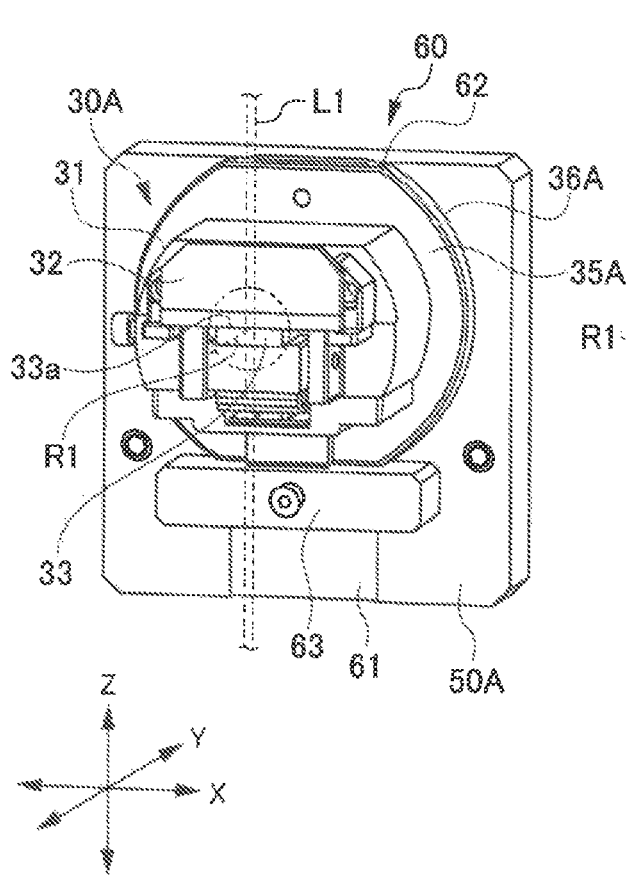
FIGS. 17A, 17B, and 17C each illustrate an ion milling apparatus according to a second embodiment of the present invention.
Figure 17B:
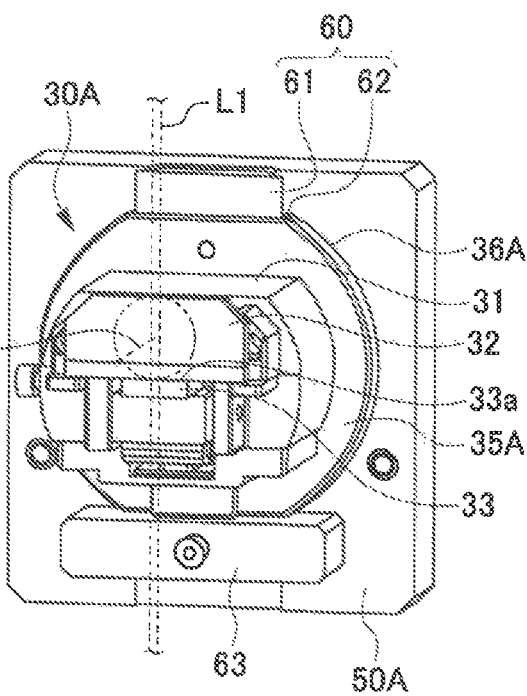
Figure 17C:
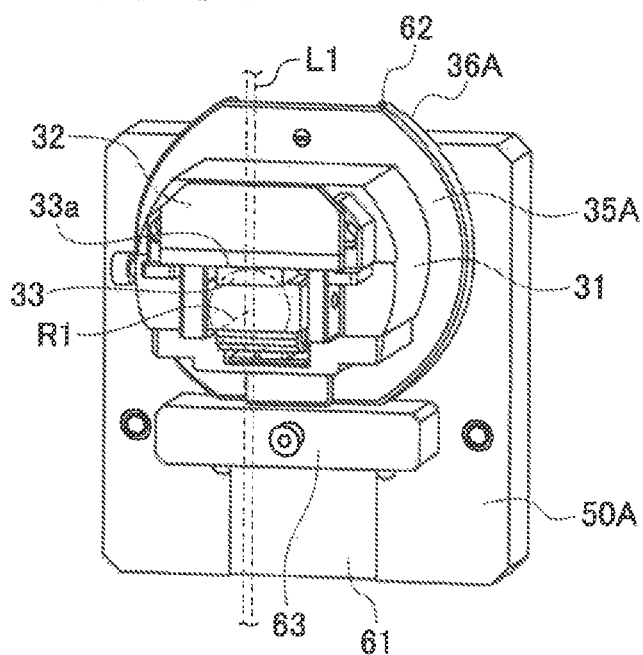

Each of FIGS. 17A to 17C is a perspective view of the ion milling apparatus according to the second embodiment.

The ion milling apparatus according to the second embodiment differs from the ion milling apparatus 1 according to the first embodiment in the location where the slide mechanism is provided. Therefore, in the second embodiment, the sample holder, the sample stage, and the slide mechanism will be described. Components that are the same as those of the ion milling apparatus 1 according to the first embodiment are given the same reference characters, and description thereof will not be repeated.

As illustrated in FIG. 17A, a slide mechanism 60 includes a stage-side guide rail 61, a holder-side slide groove 62, and a holder position adjusting member 63. The stage-side guide rail 61 is disposed on a surface of a sample stage 50A to which a sample holder 30A is attached. The stage-side guide rail 61 is disposed parallel to the third direction Z and extends between one end portion and the other end portion of the sample stage 50A in the third direction Z.

The holder-side slide groove 62 is disposed on a holder-side attachment portion 36A of the sample holder 30A. The holder-side slide groove 62 is slidably engaged with the stage-side guide rail 61. In other words, in the ion milling apparatus according to the second embodiment, the holder-side attachment portion 36A constitutes a slide member of the slide mechanism 60.

Engaging the holder-side slide groove 62 with the stage-side guide rail 61 causes the sample holder 30A to be detachably attached to the sample stage 50A. The holder-side slide groove 62 is disposed parallel to the third direction Z and extends between one end portion and the other end portion of the holder-side attachment portion 36A in the third direction Z. Thus, the holder-side attachment portion 36A is supported by the stage-side guide rail 61 of the sample stage 50A so as to be movable in the third direction Z.

The holder position adjusting member 63 is detachably attached to the stage-side guide rail 61. The holder position adjusting member 63 is in contact with an end portion in the third direction Z, that is, a lower end portion, of the sample holder 30A attached to the sample stage 50A. Being in contact with the holder position adjusting member 63, the sample holder 30A is restricted in terms of a movement to the other side in the third direction Z.

Consequently, it is possible to hold the sample holder 30A at an optional position in the third direction Z by sliding the holder-side attachment portion 36A of the sample holder 30A along the stage-side guide rail 61, as illustrated in FIGS. 17A to 17C.

In the sample holder 30A, a holder supporting portion 35A and the holder-side attachment portion 36A may be provided with a slide mechanism, as is the sample holder 30 according to the first embodiment. Consequently, it is possible to increase the movement amount in the third direction Z of the holder body 31 of the sample holder 30A, that is, the movement amount in the third direction Z of the sample 33.

The position in the third direction Z of the sample holder 30A is roughly adjusted by using the slide mechanism 60 disposed on the sample stage 50A. Then, the position of the sample 33 in the sample holder 30A may be finely adjusted by using the slide mechanism disposed on the sample holder 30A.

Moreover, a guide rail may be disposed on the holder-side attachment portion 36A, and a slide groove configured to be slidably engaged with the guide rail may be disposed on the sample stage 50A.

Other configurations are the same as those of the ion milling apparatus 1 according to the first embodiment, and thus, description thereof will be omitted. The ion milling apparatus having the aforementioned configurations is also capable of providing the same effects as those of the ion milling apparatus 1 according to the aforementioned first embodiment.

Note that the present invention is not limited to the embodiments described above and illustrated in the drawings, and that the present invention can be variously modified within the scope of the spirit of the invention disclosed in the claims.

In the aforementioned embodiments, an example in which the holder supporting portion 35 and the holder-side attachment portion 36A are moved by a hand of a user is described; however, the embodiments are not limited thereto. For example, a drive motor may be provided, and in addition, a transmission mechanism that transmits a driving force from the drive motor to the holder supporting portion 35 and the holder-side attachment portion 36A may be provided so that the holder supporting portion 35 and the holder-side attachment portion 36A are moved by the drive motor.

In the present specification, terms such as "parallel" and "perpendicular" are used; however, these terms are not used to mean only exact parallel or exact perpendicular. The "parallel" and "perpendicular" also mean, in addition to parallel and perpendicular, substantially parallel and substantially perpendicular, respectively, capable of exhibiting the respective functions of parallel and perpendicular.

What is claimed is:

1. An ion milling apparatus comprising:
an ion irradiation source that emits an ion beam;
a sample holder comprising a shielding plate that blocks the ion beam, the sample holder holding a sample such that the sample protrudes from the shielding plate in a direction perpendicular to an optical axis of the ion beam;
a sample stage to which the sample holder is attached;
a rotation mechanism comprising a rotation shaft and disposed such that a rotation center of the rotation shaft is perpendicular to the optical axis of the ion beam and parallel to a direction in which the sample protrudes from the shielding plate, the rotation mechanism supporting the sample stage such that the sample stage is rotatable; and
a slide mechanism that supports the sample held by the sample holder such that the sample is movable in a direction along the optical axis of the ion beam,
wherein the slide mechanism is provided in the sample holder and is arranged parallel to the optical axis of the ion beam and perpendicular to the direction in which the sample protrudes from the shielding plate,
wherein the sample holder comprises:
a holder body on which the shielding plate and a sample holding portion that holds the sample are disposed;
a holder supporting portion that supports the holder body; and
a holder-side attachment portion detachably attached to the sample stage,
wherein the holder supporting portion is movably supported on the holder-side attachment portion via the slide mechanism, and
wherein the holder supporting portion comprises a holding hole, to which a holding screw is fastened and fixed.

2. An ion milling apparatus comprising:
an ion irradiation source that emits an ion beam;
a sample holder comprising a shielding plate that blocks the ion beam, the sample holder holding a sample such that the sample protrudes from the shielding plate in a direction perpendicular to an optical axis of the ion beam;
a sample stage to which the sample holder is attached;
a rotation mechanism comprising a rotation shaft and disposed such that a rotation center of the rotation shaft is perpendicular to the optical axis of the ion beam and parallel to a direction in which the sample protrudes from the shielding plate, the rotation mechanism supporting the sample stage such that the sample stage is rotatable; and
a slide mechanism that supports the sample held by the sample holder such that the sample is movable in a direction along the optical axis of the ion beam,
wherein the slide mechanism is provided between the sample holder and the sample stage,
wherein the sample holder is movably supported on the sample stage via the slide mechanism,
wherein the sample holder comprises:
a holder body on which the shielding plate and a sample holding portion that holds the sample are disposed;
a holder supporting portion that supports the holder body; and
a holder-side attachment portion detachably attached to the sample stage,
wherein the holder supporting portion is movably supported on the holder-side attachment portion via the slide mechanism, and
wherein the holder supporting portion comprises a holding hole, to which a holding screw is fastened and fixed.

3. A sample holder comprising:
a sample holding portion that holds a sample;
a shielding plate that is disposed at one end of the sample holding portion and that covers a portion of a process surface of the sample;
a holder body that includes the sample holding portion and the shielding plate;
a holder supporting portion that supports the holder body;
a holder-side attachment portion that supports the holder supporting portion such that the holder supporting portion is movable; and
a slide mechanism that supports the sample held by the sample holding portion such that the sample is movable in a direction along an optical axis of an ion beam,
wherein the sample holding portion holds the sample such that a portion of the sample protrudes from the shielding plate,
wherein the holder-side attachment portion supports the holder supporting portion such that the holder supporting portion is movable in a direction perpendicular to a direction in which the sample protrudes from the shielding plate and perpendicular to the process surface of the sample,
wherein the holder supporting portion is movably supported on the holder-side attachment portion via the slide mechanism, and wherein the holder supporting portion comprises a holding hole, to which a holding screw is fastened and fixed.

* * * * *